United States Patent
Louh (10) Patent No.: US 8,298,841 B2
(45) Date of Patent: Oct. 30, 2012

(54) METHOD FOR MANUFACTURING LIGHT EMITTING DIODE PACKAGE

(75) Inventor: Sei-Ping Louh, New Taipei (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/325,008

(22) Filed: Dec. 13, 2011

(65) Prior Publication Data

US 2012/0083057 A1   Apr. 5, 2012

Related U.S. Application Data

(62) Division of application No. 12/728,260, filed on Mar. 21, 2010, now Pat. No. 8,207,549.

(30) Foreign Application Priority Data

Sep. 2, 2009  (CN) .......................... 2009 1 0306472

(51) Int. Cl.
*H01L 21/00* (2006.01)

(52) U.S. Cl. ................ 438/27; 257/98; 257/88; 257/40; 257/666; 257/774; 257/776; 257/724; 257/13

(58) Field of Classification Search .................... 438/27; 257/98, 88, 40, 666, 724–786, 13
See application file for complete search history.

(56) References Cited

U.S. PATENT DOCUMENTS

| | | | |
|---|---|---|---|
| 6,987,320 B2* | 1/2006 | Miyachi et al. | 257/746 |
| 7,180,174 B2* | 2/2007 | Koning et al. | 257/706 |
| 7,439,670 B2* | 10/2008 | Winters et al. | 313/504 |
| 7,768,026 B2 | 8/2010 | Cheng | |
| 7,800,297 B2* | 9/2010 | Reddy | 313/504 |
| 8,143,079 B2* | 3/2012 | Scianna et al. | 438/27 |
| 2003/0127973 A1* | 7/2003 | Weaver et al. | 313/504 |
| 2004/0023010 A1* | 2/2004 | Bulovic et al. | 428/209 |
| 2005/0126628 A1* | 6/2005 | Scher et al. | 136/263 |
| 2006/0063029 A1* | 3/2006 | Jang et al. | 428/690 |
| 2008/0066802 A1* | 3/2008 | Reddy | 136/258 |
| 2009/0161213 A1* | 6/2009 | Lin et al. | 359/485 |
| 2011/0127552 A1* | 6/2011 | Van Herpen et al. | 257/98 |

FOREIGN PATENT DOCUMENTS

| | | |
|---|---|---|
| JP | 2004-87213 A | 3/2004 |
| TW | 200929520 A | 7/2009 |
| WO | 2009060227 A2 | 5/2009 |

* cited by examiner

*Primary Examiner* — Marc Armand
*Assistant Examiner* — Bilkis Jahan
(74) *Attorney, Agent, or Firm* — Altis Law Group, Inc.

(57) ABSTRACT

A method for manufacturing a light emitting diode package, includes: providing a light emitting chip structure comprising a substrate and a light emitting layer; treating the light emitting layer to form at least two spaced light emitting chips on the substrate, the light emitting chips each comprising a first surface away from the substrate and a second surface; forming a first carbon nanotube layer covering the first surfaces of the at least two spaced light emitting chips; removing the substrate; forming a second carbon nanotube layer on the second surfaces of the light emitting chips, thus obtaining a first carbon nanotube layer and a second carbon nanotube layer on opposite sides of the at least two spaced light emitting chips; and packaging the light emitting chip structure to obtain the light emitting diode package.

17 Claims, 7 Drawing Sheets

METHOD FOR MANUFACTURING LIGHT EMITTING DIODE PACKAGE

CROSS-REFERENCE TO RELATED APPLICATION

This application is a divisional application of U.S. patent application Ser. No. 12/728,260, filed on Mar. 21, 2010 and entitled "LIGHT EMITTING DIODE PACKAGE AND METHOD FOR MANUFACTURING SAME". The disclosure of such parent application is incorporated herein by reference.

BACKGROUND

1. Technical Field

The present disclosure relates to a method for manufacturing a light emitting diode package.

2. Description of Related Art

A typical light emitting diode package includes a light emitting chip, two electrodes attached to opposite surfaces of the light emitting chip and a housing for receiving the light emitting chip and the two electrodes. However, a material of the electrodes is generally metal, such as copper or gold. This decreases light emitting efficiency of the light-emitting diode package.

Therefore, a method for manufacturing a light emitting diode package, which can overcome the above-mentioned problems, are needed.

BRIEF DESCRIPTION OF THE DRAWINGS

FIGS. 5a to 5h show schematic views of the method of manufacturing the light emitting diode package of FIG. 4.

DETAILED DESCRIPTION

Figure 1:
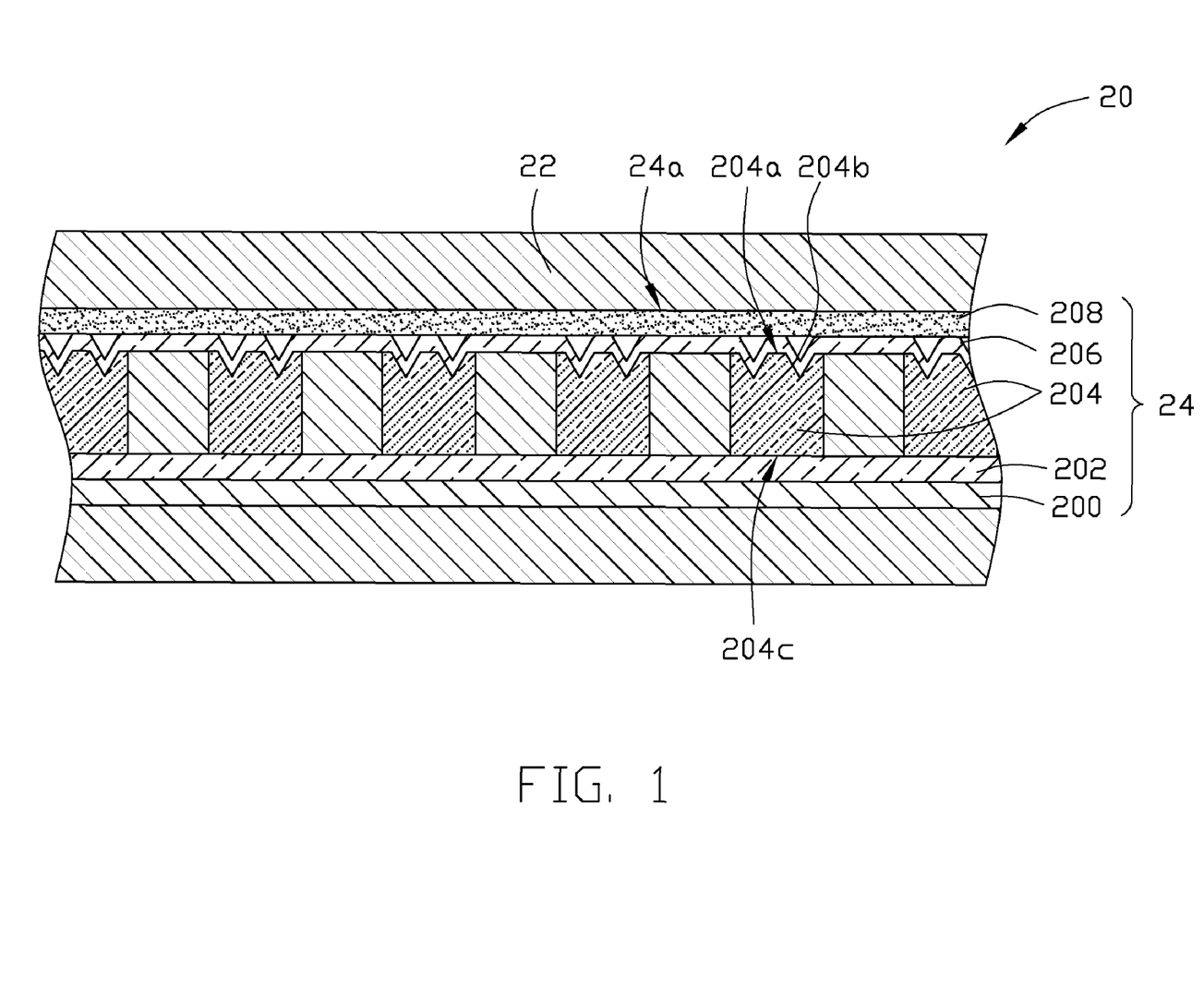
FIG. 1 is a sectional view of a light emitting diode package, according to a first exemplary embodiment.
Figure 2:
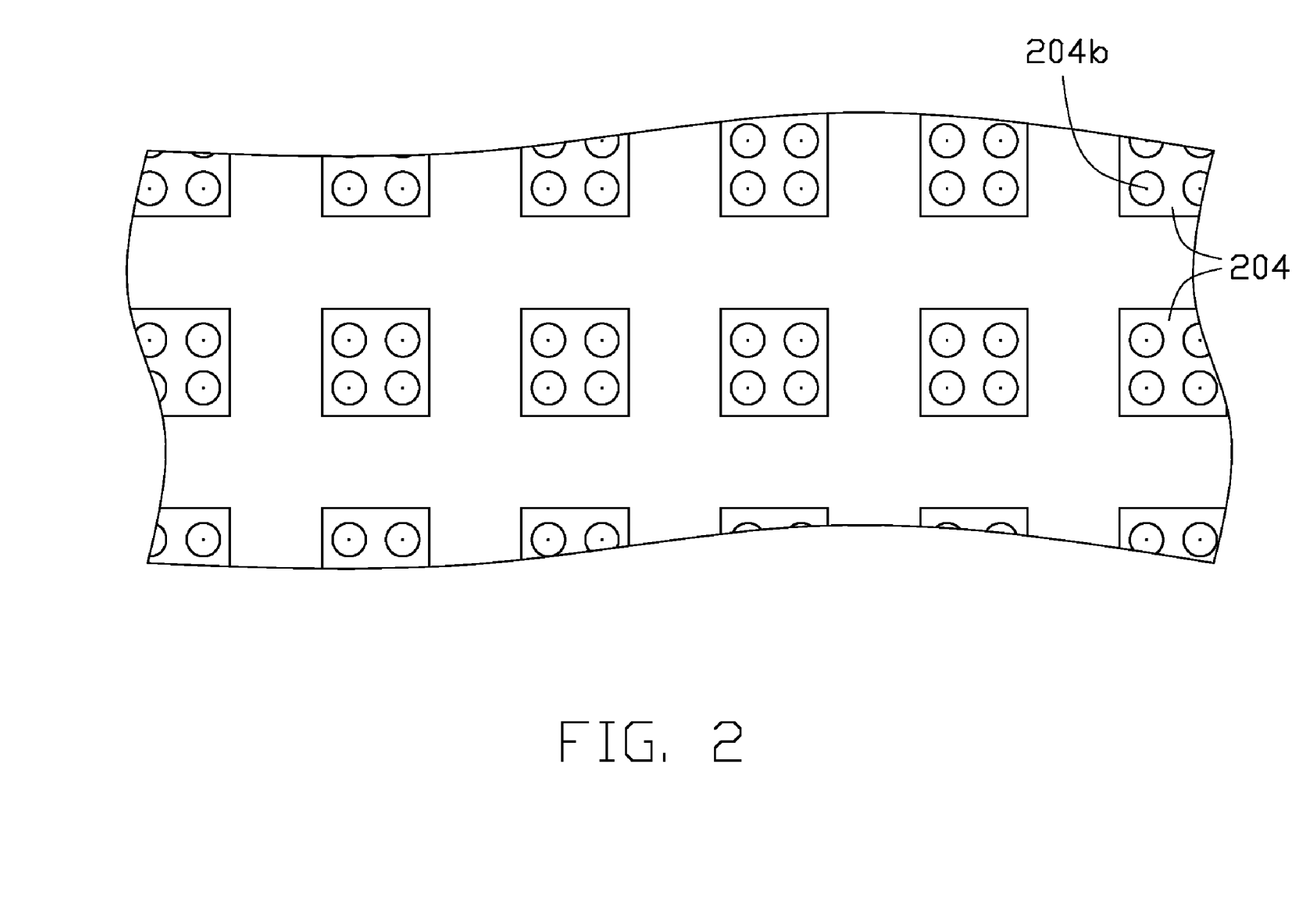
FIG. 2 is a planar view of the light emitting diode package of FIG. 1.

Referring to FIGS. 1 and 2, a light emitting diode package 20, according to a first exemplary embodiment, includes a housing 22, and a light emitting unit 24 received in the housing 22.

The housing 22 may be made from polymethylmethacrylate (PMMA) or epoxy resin and protects the light emitting unit 24.

In this embodiment, the light emitting unit 24 emits a white light and includes a light reflective layer 200, a first carbon nanotube (CNT) layer 202, a plurality of light emitting chips 204, a second CNT layer 206, and a phosphor layer 208. The first CNT layer 202 is formed on the light reflective layer 200. The plurality of light emitting chips 204 are formed on the first CNT layer 202 in an array (see FIG. 2). The second CNT layer 206 is transparent to visible light and covers the light emitting chips 204. The phosphor layer 208 is formed on the second CNT layer 206. The CNT layers 202, 206 serve as two electrodes of the light emitting diode package 20.

The light reflective layer 200 is a silver reflective layer with a thickness of about 20-25 microns. The light reflective layer 200 is configured for reflecting light toward a light emitting surface 24a of the light emitting unit 24. This increases utilization rate of light.

Each light emitting chip 204 is a semiconductor light source including at least an n-type semiconductor layer, a p-type semiconductor layer and a p-n junction semiconductor layer between the p-type and n-type semiconductor layers and emits a blue light. The phosphor layer 208 is a layer comprising yttrium aluminum garnet (YAG) crystal, such as an epoxy-resin layer comprising the YAG crystal. The light emitting chip 204 emits the blue light with a wavelength of about 400-530 nanometers. The blue light excites the phosphor layer 208 to emit a yellow light. Then the blue light and the yellow light are mixed to form the white light. It is to be understood that, in alternative embodiments, the phosphor layer 208 may be made from other material rather than the epoxy-resin layer comprising the YAG crystal, and the light emitting chip 204 may emit a colored light to excite the phosphor layer 208 to emit other colored light. In further alternative embodiments, the phosphor layer 208 may be omitted, and then the light emitting diode package 20 emits light the same color as the light from the light emitting chips 24.

The light emitting chip 204 includes a light outgoing surface 204a and a bottom surface 204c at opposite sides of the light emitting chip 204. The light emitting chip 204 further includes microstructures 204b formed on the light outgoing surface 204a. The first CNT layer 202 is formed on the bottom surface 204c. An area of each light outgoing surface 204a is about 1 square millimeter (about 1 millimeter long by about 1 millimeter wide). A thickness of the light emitting chip 204, i.e., measured from the bottom surface 204c to the light outgoing surface 204a, is greater than about 200 microns.

In this embodiment, the microstructures 204b formed on the light outgoing surface 204a include a plurality of cone-shaped grooves 204b defined in the light outgoing surface 204a. A depth of each groove 204b is about 3-10 microns. The microstructures 204b can converge light emitted from the corresponding light emitting chip 204 to enhance brightness of the light emitting diode package 20.

When covering the light emitting chips 204, parts of the second CNT layer 206 may be attached inside the grooves 204b. This enhances a contact area between the second CNT layer 206 and the light emitting chips 204. Accordingly, a conductivity between the second CNT layer 206 and the light emitting chips 204 can be enhanced.

The first and second CNT layers 202, 206 include (a) CNT film(s). Methods for making a CNT film may include a direct growth method, a flocculating method, a pressing method or a pulling method.

The direct growth method is used to grow CNT films directly on a substrate.

The flocculating method for making a CNT film includes the following steps: adding a plurality of CNTs to a solvent to create a CNT floccule structure in the solvent; separating the CNT floccule structure from the solvent; and shaping the separated CNT floccule structure into the CNT film. The CNT film made by the flocculating method includes a plurality of isotropic CNTs twisted with each other and disorderly distributed therein.

The pressing method for making a CNT film includes the following steps: forming an array of CNTs on a substrate; and pressing the array of CNTs using a compressing apparatus, thereby forming a CNT film. The CNT film made by the pressing method includes a plurality of CNTs aligned in one or more directions.

In this embodiment, the pulling method is adopted to make the CNT film.

Figure 3:
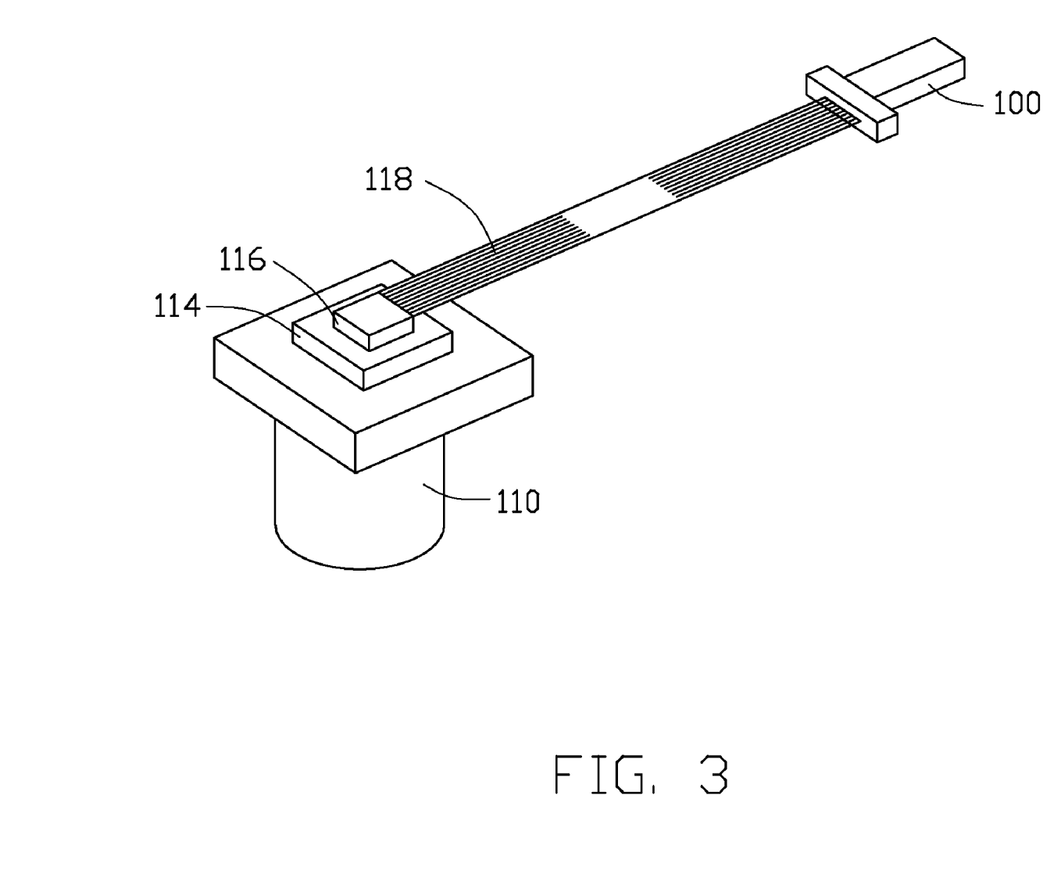
FIG. 3 is an isometric and schematic view of a method for manufacturing a carbon nanotube film used in the light emitting diode package of FIG. 1.
Figure 4:
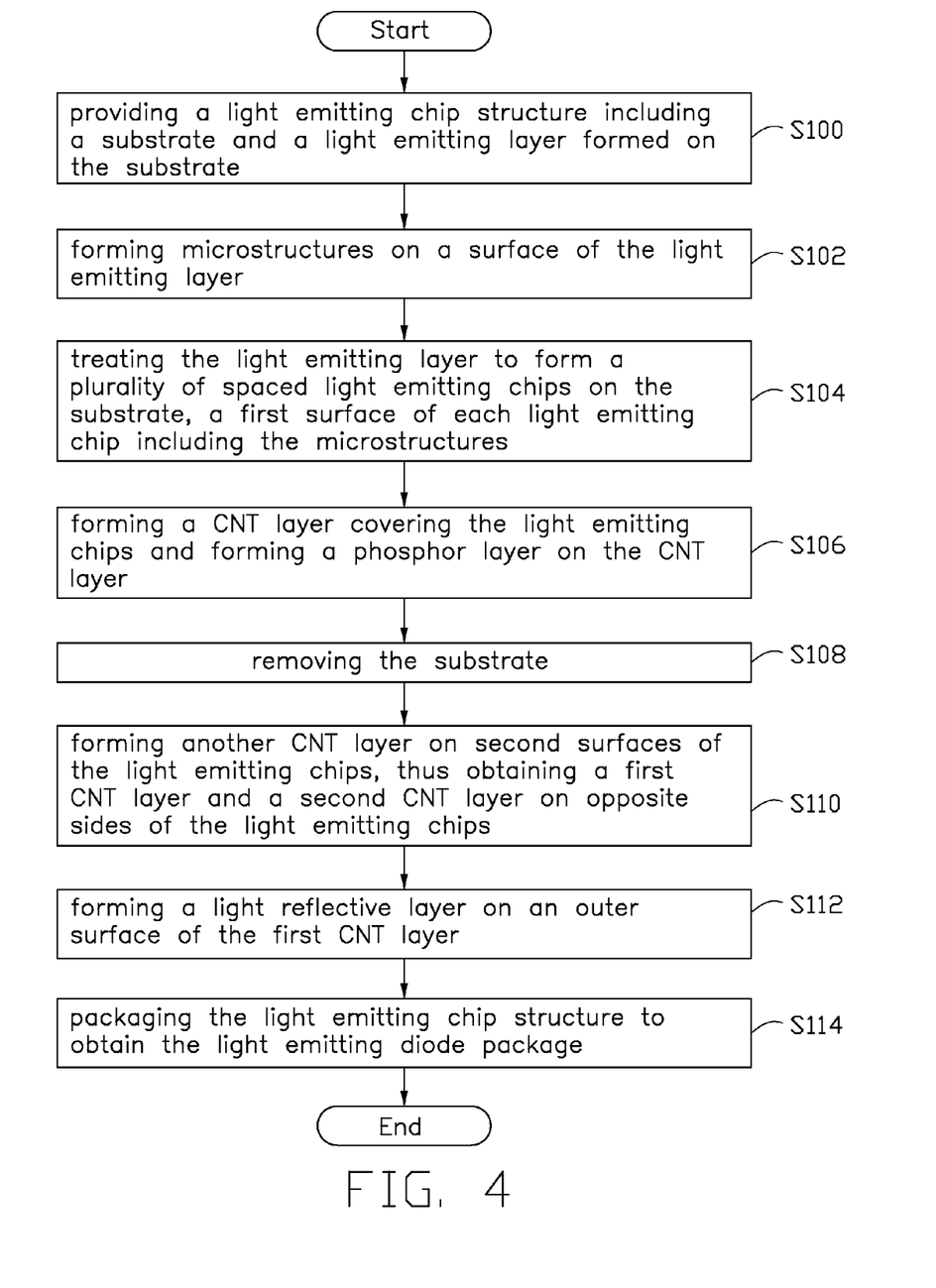
FIG. 4 is a flow chart of a method for manufacturing a light emitting diode package, according to a second exemplary embodiment.

Referring to FIG. 3, in step (a), the pulling method includes the following sub-steps: (a1) providing a CNT array 116, specifically, a super-aligned CNT array 116, on a substrate 114; and (a2) pulling out a CNT film 118 from the CNT array 116 with a pulling tool 100 (e.g., adhesive tape, pliers, tweezers, or another tool allowing multiple CNTs to be gripped and pulled simultaneously).

In step (a1), the method for making the super-aligned CNT array 116 on the substrate 114 includes the following sub-steps: (a11) providing a substantially flat and smooth substrate 114; (a12) forming a catalyst layer on the substrate 114; (a13) annealing the substrate 114 with the catalyst layer thereon at a temperature ranging from 700° C. to 900° C. in air for about 30 to 90 minutes; (a14) heating the substrate 114 with the catalyst layer at a temperature ranging from 500° C. to 740° C. in a furnace with a protective gas therein; and (a15) supplying a carbon source gas into the furnace for about 5 to 30 minutes, and growing a super-aligned CNT array 116 from the substrate 114.

In step (a11), the substrate 114 can be a P-type silicon wafer, an N-type silicon wafer, or a silicon wafer with a film of silicon dioxide thereon. A 4-inch P-type silicon wafer is used as the substrate 114 of the present example.

In step (a12), the catalyst layer can be made of iron (Fe), cobalt (Co), nickel (Ni), or any alloy thereof.

In step (a14), the protective gas can be made up of at least one of nitrogen ($N_2$), ammonia ($NH_3$), and a noble gas. In step (a15), the carbon source gas can be a hydrocarbon gas, such as ethylene ($C_2H_4$), methane ($CH_4$), acetylene ($C_2H_2$), ethane ($C_2H_6$), or any combination thereof.

The super-aligned CNT array 116 can be approximately 200 to 400 microns in height and includes a plurality of CNTs parallel to each other and substantially perpendicular to the substrate 114. The super-aligned CNT array 116 formed under the above conditions is essentially free of impurities, such as carbonaceous or residual catalyst particles. The CNTs in the super-aligned CNT array 116 are packed together closely by van der Waals attractive force.

In the present example, the substrate 114 is fixed on a sample platform 110 by an adhesive tape or a binding admixture. Alternatively, the substrate 114 is mechanically fixed on the sample platform 110.

In step (a2), the CNT film 118 can be formed by the following sub-steps: (a21) selecting a plurality of CNTs having a predetermined width from the super-aligned CNT array 116, binding the CNTs to the pulling tool 100; and (a22) pulling the CNTs at an even/uniform speed to achieve the CNT film 118.

In step (a21), the CNTs having a predetermined width can be selected by using a wide adhesive tape as the tool 100 to contact the super-aligned CNT array 116. In step (a22), the pulling direction is substantially perpendicular to the growing direction of the super-aligned CNT array 116.

During the pulling process, initial CNTs segments are drawn out, other CNT segments are also drawn out end-to-end due to the van der Waals attractive force between ends of adjacent segments. This process of drawing ensures a successive CNT film 118 can be formed. The CNTs of the CNT film 118 are all substantially parallel to the pulling direction and connected end-to-end.

More specifically, during the pulling process, as a thickness of the CNT segments is not substantially equal, the thickness of the CNT film formed by pulling is not substantially equal, and it includes a plurality of bundles with larger diameters. The bundles with larger diameter have low light transmittance, and as a result, the CNT films 118 also have low light transmittance (less than 75%).

Width of the CNT film 118 depends on the size of the CNT array 116. Length of the CNT film 118 is arbitrary and may be determined according to need. In the present example, when the size of the substrate 114 is 4 inches, the width of the CNT film 118 approximately ranges from 1 to 10 centimeters, and the thickness of the CNT film 118 approximately ranges from 0.01 to 100 microns.

Because the light emitted from the light emitting chips 204 has to pass through the second CNT layer 206, the requirement for a transparency of the second CNT layer 206 is higher than that of the first CNT layer 202. In the method of manufacturing the second CNT layer 206, after pulled out from the CNT array 116, the CNT film 118 is treated to achieve higher transparency.

In detail, the treatment may be executed in an atmosphere comprising of oxygen therein. In the present embodiment, the treatment is executed in an ambient atmosphere.

The treatment includes the following steps: (a) heating a part of the CNT film 118 to make partial CNTs in the part of the CNT film 118 oxidized; (b) moving the CNT film 118 to make partial CNTs in other parts of the CNT film 118 oxidized so that the entire CNT film 118 is treated.

Specifically, in the step (a), the heating may be executed using a laser device or a microwave generating device. For example, the laser device may emit laser beams with a power density of greater than $0.1 \times 10^4$ W/m$^2$. The CNTs in the CNT film 118 absorb energy from laser irradiation and the temperature thereof is increased. The CNT bundles with larger diameters will absorb more energy and be destroyed. When the CNT bundles in the CNT film 118 are destroyed due to absorbing too much energy from the laser irradiation, a transparent CNT film will be acquired. In the present embodiment, after laser irradiation, the light transmittance of the transparent CNT film is greater than 75%.

Furthermore, the CNT film 118 is adhesive because the CNTs have relatively large specific areas so that the CNT film 118 can be directly attached to the light emitting chip 204 to form the CNT layers 202, 206. More specifically, the CNT layers 202, 206 may include at least two stacked CNT films 118. An angle α between the aligned directions of stacked CNTs in two adjacent CNT films 118 is in a range of $0° \leq \alpha \leq 90°$. Furthermore, silver glue may be applied to joints between the two adjacent CNT films 118 to enhance conductivity of the CNT layers 202, 206.

In this embodiment, a thickness of the first CNT layer 202 is greater than that of the second CNT layer 206. This is because the first CNT layer 202 needs to dissipate heat generated by the light emitting chips 204.

Adhesive conductive means may be applied between the CNT layers 202, 206 and the light emitting chips 204 to enhance electrical and physical connection strengths. The adhesive means may include silver glue and other suitable adhesive conductive means.

Referring to FIGS. 4, and 5a-5h, a method for manufacturing the light emitting diode package 20, according to a second exemplary embodiment, includes steps S100 through S114.

Step S100: providing a light emitting chip structure 30 including a substrate 32 and a light emitting layer 34 formed on the substrate 32; step S102: forming microstructures 204b on a surface 34a of the light emitting layer 34; step S104: treating the light emitting layer 34 to form a plurality of spaced light emitting chips 204 on the substrate 32, a first surface 204a of each light emitting chip 204 including the microstructures 204b; step S106: forming a CNT layer 206 covering the light emitting chips 204 and forming a phosphor layer 208 on the CNT layer 206; step S108: removing the substrate 32; step S110: forming another CNT layer 202 on second surfaces 204c of the light emitting chips 204, thus obtaining a first CNT layer 202 and a second CNT layer 206 on opposite sides of the light emitting chips 204; step S112: forming a light reflective layer 200 on an outer surface 202a of the first CNT layer 202; step S114: packaging the light emitting chip structure 30 to obtain the light emitting diode package 20.

In step S100, the light emitting chip structure 30 is a blue-light light emitting chip structure 30. In steps S102 and S104, referring to FIGS. 5b to 5d, a plasma etching process may be used to form the microstructures 204b and the spaced light emitting chips 204. The microstructures 204b include a plurality of cone-shaped grooves 204b. When forming the spaced light emitting chips 204, a photomask 400 may be positioned on the surface 34a of the light emitting chip structure 30. The photomask 400 defines a plurality of through holes 402 to form patterns on the light emitting layer 34.

Figure 5A:
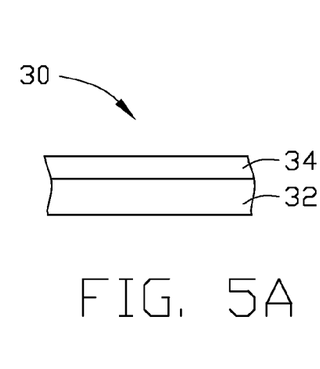
Figure 5B:
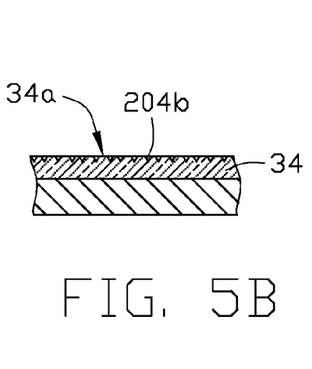
Figure 5C:
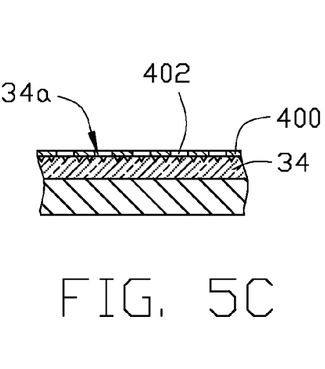
Figure 5D:
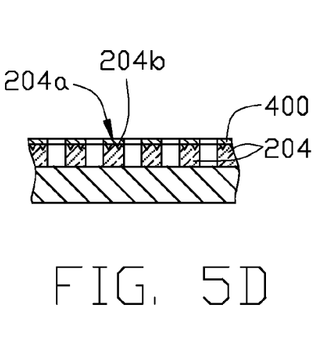
Figure 5E:
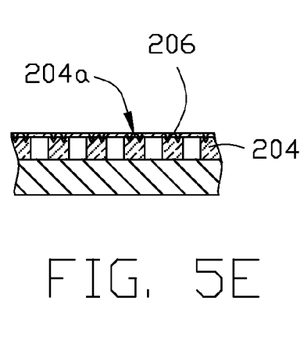
Figure 5F:
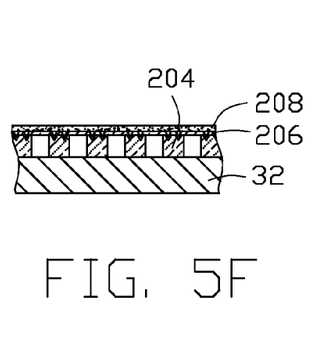

In step S106, the phosphor layer 208 is a layer comprising yttrium aluminum garnet (YAG) crystal, such as an epoxy-resin layer comprising the YAG crystal. In step S108, the substrate 32 is removed by irradiating joints between the substrate 32 and the light emitting layer 34 with a laser.

Figure 5G:
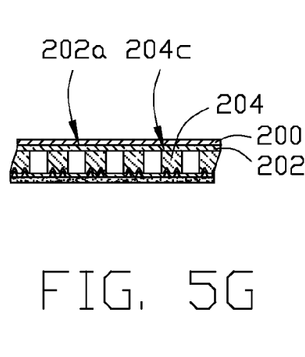

In step S110, the light emitting chips 204 may be turned upside down to form the CNT layer 202 on the second surfaces 204c of the light emitting chips 204. In step S112, the light reflective layer 200 is a silver reflective layer and may be formed on the first CNT layer 202 by a sputter-coating process.

In step S114, the light emitting chip structure 30 is packaged in the housing 22. The housing 22 may be made from polymethylmethacrylate (PMMA) or epoxy resin.

Because of their good light transmittance and conductivity, the CNT layers 202, 206 are used as electrodes of the light emitting diode package 20. This increases light-emitting efficiency of the light emitting diode package 20. Furthermore, because of the plurality of spaced light emitting chips 204 formed between the CNT layers 202, 206 and flexibility of the CNT layers 202, 206, the light emitting unit 24 can be conveniently bent for attaching to curved surfaces, such as cylindrical walls before packaging.

Figure 6:
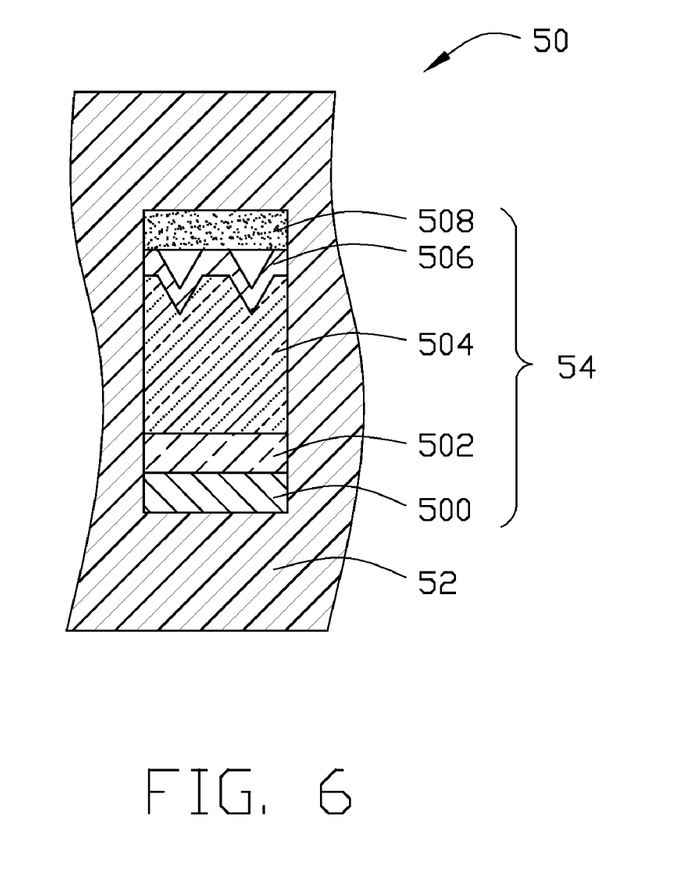
FIG. 6 is a sectional view of a light emitting diode package, according to a third exemplary embodiment.

Referring to FIG. 6, a light emitting diode package 50, according to a third exemplary embodiment, is shown. The light emitting diode package 50 includes a housing 52, a light emitting unit 54 received in the housing 52.

The light emitting unit 54 includes a light reflective layer 500, a first CNT layer 502 formed on the light reflective layer 500, a light emitting chip 504 formed on the first CNT layer 502, a second CNT layer 506 formed on the light emitting chip 504, and a phosphor layer 508 formed on the second CNT layer 506.

The light emitting diode package 50 may be obtained by cutting the light emitting diode package 20 of the first embodiment.

Figure 7:
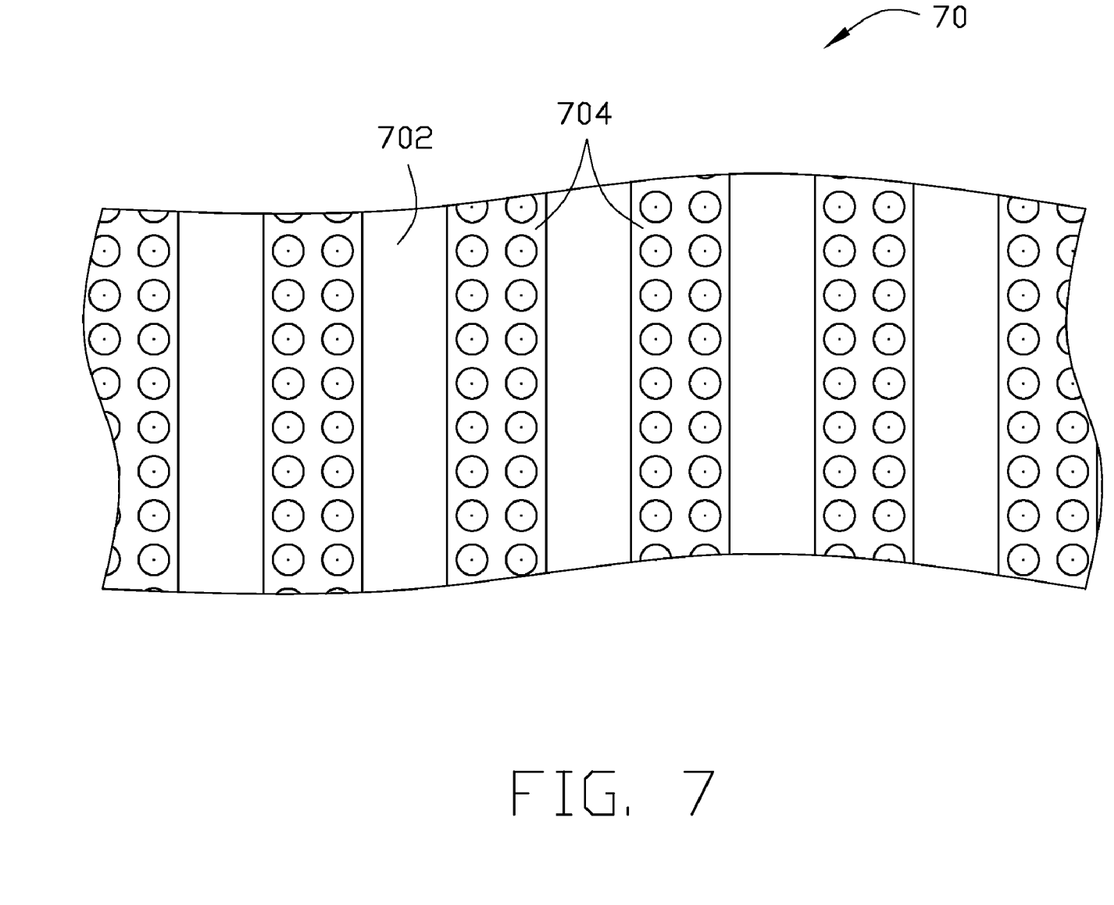
FIG. 7 is a planar view of a light emitting diode package, according to a fourth exemplary embodiment.

Referring to FIG. 7, a light emitting diode package 70, according to a fourth exemplary embodiment, is shown. The difference between the light emitting diode package 70 and the light emitting diode package 20 of the first embodiment is that the light emitting diode package 70 includes a plurality of spaced stripe-shaped light emitting chips 704 formed on a first CNT layer 702.

Advantages of the third and fourth embodiments are same as those of the first embodiment.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a light emitting diode package, comprising:
   providing a light emitting chip structure comprising a substrate and a light emitting layer formed on the substrate, the light emitting layer being a semiconductor light source and having a first surface away from the substrate;
   treating the light emitting layer to form at least two spaced light emitting chips on the substrate, the at least two spaced light emitting chips each comprising a first surface away from the substrate and a second surface engaging with the substrate and opposite to the first surface;
   forming a first carbon nanotube layer covering the first surfaces of the at least two spaced light emitting chips;
   removing the substrate to expose the second surfaces of the at least two spaced light emitting chips;
   forming a second carbon nanotube layer on the second surfaces of the at least two spaced light emitting chips, thus obtaining a first carbon nanotube layer and a second carbon nanotube layer on opposite sides of the at least two spaced light emitting chips; and
   packaging the light emitting chip structure to obtain the light emitting diode package.

2. The method of claim 1, wherein before treating the light emitting layer, further comprising: forming microstructures on the first surface of the light emitting layer.

3. The method of claim 2, wherein the microstructures comprise a plurality of cone-shaped grooves.

4. The method of claim 1, wherein a phosphor layer is formed on the first carbon nanotube layer before packaging the light emitting chip structure.

5. The method of claim 1, wherein the first carbon nanotube layer comprises at least two stacked carbon nanotube films, and an angle $\alpha$ between the aligned directions of stacked carbon nanotubes in two adjacent carbon nanotube films is in a range of $0° \leq \alpha \leq 90°$.

6. The method of claim 1, wherein the second carbon nanotube layer comprises at least two stacked carbon nanotube films, and an angle $\alpha$ between the aligned directions of stacked carbon nanotubes in two adjacent carbon nanotube films is in a range of $0° \leq \alpha \leq 90°$.

7. The method of claim 1, wherein the first and second carbon nanotube layers are electrically conductive and a transparency of the second carbon nanotube layer is higher than that of the first carbon nanotube layer.

8. The method of claim 1, wherein before forming a first carbon nanotube layer covering the first surfaces of the at least two spaced light emitting chips, further comprising: treating the first carbon nanotube layer to enhance a transparency of the first carbon nanotube layer.

9. The method of claim 1, wherein before packaging the light emitting chip structure, further comprising: forming a light reflective layer on an outer surface of the second carbon nanotube layer.

10. The method of claim 1, wherein the at least two spaced light emitting chips emit blue light.

11. A method for forming a light emitting diode package, comprising:

provrding a substrate and a light emitting layer on the substrate, the light emitting layer being a semiconductor light source and having a first surface away from the substrate, the light emitting layer being capable of generating light when an electric current is applied thereto;

forming a first carbon nanotube layer covering the first surface of the light emitting layer;

removing the substrate to expose a second surface of the light emitting layer; and forming a second carbon nanotube layer on the second surface of the light emitting layer, thus obtaining the light emitting diode package, wherein the first and second carbon nanotube layers are light pervious, electrically conductive, and configured as electrodes for the light emitting diode package to receive the electric current, and a transparency of the first carbon nanotube layer is higher than that of the second carbon nanotube layer.

12. The method of claim 11 further comprising a step of forming a reflective layer on an outer surface of the second carbon nanotube layer.

13. The method of claim 12 further comprising a step of forming a phosphor layer on an outer surface of the first carbon nanotube layer.

14. The method of claim 13, further comprising a step of packaging the light emitting layer, the first and second carbon nanotube layers, the reflective layer and the phosphor layer in a housing.

15. The method of claim 14, wherein the housing is made of one of polymethylmethacrylate (PMMA) and epoxy resin.

16. The method of claim 11, wherein before forming the first carbon nanotube layer, further comprising: forming microstructures on the first surface of the light emitting layer.

17. The method of claim 16, wherein the microstructures comprise a plurality of cone-shaped grooves.

* * * * *